United States Patent [19]

Enomoto et al.

[11] 3,819,952

[45] June 25, 1974

[54] SEMICONDUCTOR DEVICE

[75] Inventors: Tatsuya Enomoto; Hiroshi Morita, both of Itami, Japan

[73] Assignee: Mitsubishi Denki Kabushiki Kaisha, Tokyo, Japan

[22] Filed: Jan. 29, 1973

[21] Appl. No.: 327,463

[52] U.S. Cl................... 307/202, 307/251, 307/279, 307/304, 317/33 SC, 307/205, 317/235 G

[51] Int. Cl............................................... H02h 7/20

[58] Field of Search........... 307/202, 251, 279, 205, 307/304; 317/235 R, 235 B, 235 G, 33 SC

[56] References Cited

UNITED STATES PATENTS

| | | | |
|---|---|---|---|
| 3,395,290 | 7/1968 | Farina et al. | 307/202 |
| 3,407,339 | 10/1968 | Booher | 317/33 |
| 3,597,626 | 8/1971 | Heightley | 307/203 |
| 3,636,385 | 1/1972 | Koepp | 307/304 |
| 3,737,678 | 6/1973 | Dolby et al. | 307/237 |

OTHER PUBLICATIONS

W. Fischer et al., "Resistor – Thick Oxide FET Gate Prot. Dev. for Thin Oxide FET," IBM Tech. Discl. Bull., Vol. 13, No. 5, Oct. 1970, pp. 1272, 1273.

U. Baitinger et al., "Constant-Current Source Network," IBM Tech. Discl. Bull., Vol. 13, No. 9, Feb. 1971, p. 2516.

P. Krick et al., "Two-Device Memory Cell with Active Substrate Control" IBM Tech. Discl. Bull., Vol. 15, No. 5, Oct. 1972, pp. 1609–1610.

*Primary Examiner*—Rudolph V. Rolinec
*Assistant Examiner*—Joseph E. Clawson, Jr.
*Attorney, Agent, or Firm*—Wenderoth, Lind & Ponack

[57] ABSTRACT

A first protecting insulated gate field effect (IGFE) transistor has a drain and a source connected respectively to a gate and a source of an IGFE transistor to be protected against overvoltages with the gate connected to an input through a resistor. A second protecting IGFE transistor higher in threshold voltage than the first protecting transistor has a source connected to the gate of the first protecting transistor and through another resistor to the source of the same transistor with its gate and drain operatively coupled to the input. The second protecting transistor first conducts in response to an overvoltage, applied to the input to decrease a voltage applied to the protected transistor and to conduct the first transistor. The conduction of the first transistor causes a voltage much decreased from the overvoltage to be applied to the protected transistor.

5 Claims, 6 Drawing Figures

PATENTED JUN 25 1974 3,819,952

SEMICONDUCTOR DEVICE

BACKGROUND OF THE INVENTION

This invention relates to a semiconductor device and more particularly to improvements in a protective device for protecting an insulated gate field effect transistor against overvoltages.

In order to improve the electric performance such as the threshold voltage, voltage gain etc. of insulated gate field effect (which may be abbreviated hereinafter to "IGFE") transistors, it is desirable to decrease the thickness of the insulating film disposed under the gate electrode thereof. Such a film may be called "a gate insulating film." A decrease in thickness of the gate insulating film causes a reduction in the dielectric strength thereof until a relatively low voltage may be applied across the insulating film to permanently break down it. For example, with the gate insulating film which is formed of a silicon oxide film most commonly utilized, the film having a thickness of about 1000A. will be permanently broken down by a voltage on the order of 100 volts. The protection of the gate insulating film in IGFE transistors against such permanent breakdown could be previously accomplished by protective means including a protecting IGFE transistor and resistor operatively connected to an IGFE transistor to be protected. The protecting IGFE transistor has included a gate insulating film thick enough to have a threshold voltage higher than that of the protected transistor but less than a breakdown voltage of a gate insulating film disposed in the latter transistor. This measure has decreased in the protective effect. If the thickness of the gate insulating film in the protecting IGFE transistor is attempted to decrease to increase the protective effect then the thickness of the film has been restricted to a certain limit because the protected transistor is impeded in the normal operation, or because the protecting transistor itself will be broken down.

SUMMARY OF THE INVENTION

Accordingly it is an object of the present invention to eliminate the disadvantages of the prior art practice as above described by the provision of a semiconductor device including improved protective means for satisfactorily protecting an insulated gate field effect transistor against overvoltages even though the protected transistor would include a thin gate insulating film.

The present invention accomplishes this object by the provision of a semiconductor device comprising, in combination, an insulated gate field effect transistor to be protected against overvoltages including a gate electrode and a source electrode, an input terminal, a resistor electrically connected between the input terminal and the gate electrode of the protected insulated gate field effect transistor, a first protecting insulated gate field effect transistor including a drain electrode and a source electrode electrically connected to the gate and source electrode of the protected insulated gate field effect transistor respectively and a gate electrode, a second protecting insulated gate field effect transistor including a drain, a source and a gate electrode and which is higher in threshold voltage than the first protecting insulated gate field effect transistor, and means for electrically connecting the second protecting insulated gate field effect transistor to both the input terminal and the first protecting insulated gate field effect transistor with the source electrode of the second protecting effect transistor connected to the gate electrode of the first protecting transistor so that the second protecting transistor is responsive to a voltage in excess of the threshold voltage therefor applied to the input terminal to be conducting to provide an output voltage, and that the first protecting transistor is conducting in response to the output voltage from the second protecting transistor exceeding the threshold voltage for the same.

In a preferred embodiment of the present invention, the second protecting insulated gate field effect transistor may have its gate electrode electrically connected to the input terminal, its drain electrode electrically connected to the junction of the resistor and the gate electrode of the protected insulated gate field effect transistor, and its source electrode electrically connected to the gate electrode of the first protecting insulated gate field effect transistor and also through another resistor to the source electrode of the first protecting transistor.

If desired, the second protecting insulated gate field effect transistor may have its gate and drain electrodes electrically connected to that side of the first resistor near to or remote from the input terminal.

BRIEF DESCRIPTION OF THE DRAWING

The present invention will become more readily apparent from the following detailed description taken in conjunction with the accompanying drawing in which.

DESCRIPTION OF THE PREFERRED EMBODIMENTS

Figure 1:
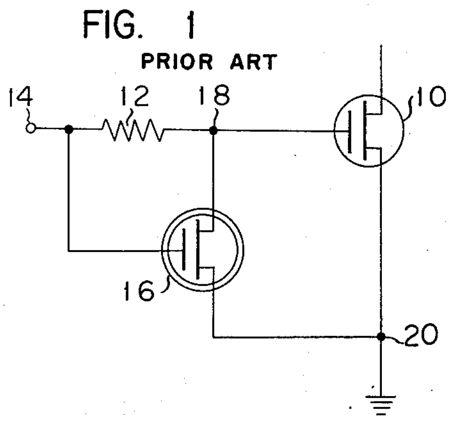
FIG. 1 is a schematic circuit diagram of a protective device for an insulated gate field effect transistor constructed in accordance with the principles of the prior art.

Referring now to the drawing and particularly to FIG. 1, there is illustrated a semiconductor protective device for protecting an insulated gate field effect (IGFE) transistor against overvoltages in accordance with the principles of the prior art. The arrangement illustrated comprises an IGFE transistor 10 to be protected including a gate electrode connected through a protecting resistor 12 to an input terminal 14, and a protecting IGFE transistor 16 including a drain electrode connected to the junction 18 of the resistor 12 and the gate electrode of the protected transistor 10, and a source electrode connected to the source electrode of the latter transistor 10 through a connection point 20 connected to ground. The protecting transistor 16 includes a gate electrode connected to the input terminal 14. The protecting IGFE transistor 16 is selected to have a threshold voltage higher than that of the protected IGFE transistor 10 but to less than a breakdown voltage of a gate insulating film (not shown) disposed in the latter transistor 10. This measure prevents the protecting IGFE transistor 16 from conducting across the source and drain electrodes within the operating region for the protected IGFE transistor 10 ensuring the normal operation of the transistor 10.

In the example illustrated, the resistor 12 is preferably formed by diffusing a suitable polarity imparting impurity into the semiconductor substrate on which the transistors have been formed.

On the other hand, if an excessive voltage higher than the breakdown voltage of the gate insulating film in the protected IGFE transistor 10 is applied to the input terminal 14 then the protecting IGFE transistor 16 becomes electrically conducting across the source and drain electrodes thereof. Then a voltage at the junction 18 or an input voltage to the gate electrode of the protected transistor 10 has a value as determined by a ratio between a dynamic resistance presented by the now conducting IGFE transistor 16 and the resistance of the diffusion resistor 12. Thus the protected transistor 10 has directly applied thereto an input voltage attenuated or decreased from the excessive voltage applied to the input terminal 14 leading to the protection of the transistor 10 to be protected against the excessive voltage.

However, due to its high threshold voltage, the protecting IGFE transistor 16 has generally a gate insulating film much thicker than that disposed in the protected IGFE transistor 10 so that the dynamic resistance presented by the conducting transistor 16 is higher than the resistance of the diffusion resistor 12. This means that the voltage at the junction 18 is not much attenuated from the excessive voltage applied to the input terminal 14. That is, the arrangement only provides a minimal protective effect.

If the protecting IGFE transistor 16 has its gate insulating film decreased in thickness in order to reduce the threshold voltage thereof then the disadvantage just described can be avoided. With its gate insulating film decreased in thickness, however the protected IGFE transistor 10 will be impeded from performing its normal operation. Alternatively the protecting IGFE transistor 16 itself may be broken down. Therefore the thickness of the gate insulating film in the protecting IGFE transistor can not be decreased beyond a certain limit.

Figure 2:
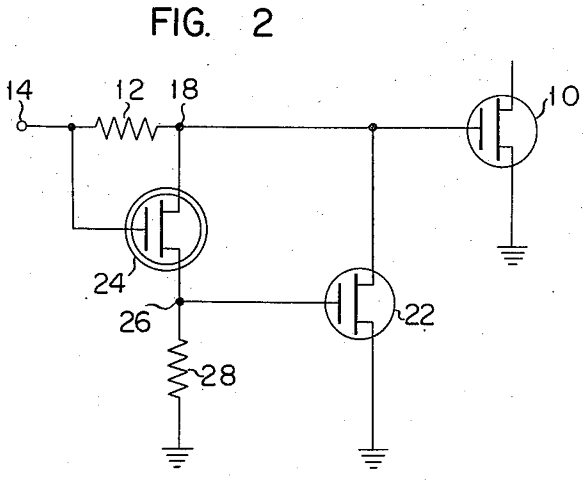
FIG. 2 is a schematic circuit diagram of a protective device for an insulated gate field effect transistor constructed in accordance with the principles of the present invention.

The present invention contemplates to eliminate the abovementioned disadvantages of the arrangement as shown in FIG. 1 through the use of a plurality of protecting IGFE transistors Referring now to FIG. 2, a circuit is illustrated for protecting an IGFE transistor against overvoltages in accordance with the principles of the present invention. As in the arrangement of FIG. 1, an IGFE transistor 10 to be protected includes a gate electrode electrically connected to an input terminal 14 through a first protecting resistor 12 formed in the same manner as the resistor 12 shown in FIG. 1 and a source electrode connected to ground. The protected IGFE transistor is an active one and its gate insulating film is thin enough to render a threshold voltage equal to a normal value suitable for general purposes, for example, −3 volts.

In order to protect the IGFE transistor 10 against an overvoltage applied to the gate electrode thereof, a protecting circuit is provided which includes a first protecting IGFE transistor 22 having a drain electrode electrically connected to the gate electrode of the protected IGFE transistor 10 and therefore to the junction 18 of the first resistor 12 and, a source electrode electrically connected to ground and hence to the source electrode of the protected transistor 10, and a gate electrode electrically connected to a source electrode of a second protecting IGFE transistor 24 through a connection point 26. The second protecting IGFE transistor 24 is electrically connected at the source electrode to a second diffusion resistor 28, and the other end of the resistor being connected to ground. Thus the source electrodes of the first and second protecting transistors 22 and 24 are electrically connected to each other through the second diffusion resistor 28. The second protecting IGFE transistor 24 includes a drain electrode electrically connected to the junction 18 and a gate electrode electrically connected to the input terminal 14.

In the arrangement of FIG. 2, the application of a voltage to the gate electrode of the second protecting IGFE transistor 26 or to the input terminal 14 must not cause the second protecting IGFE transistor 26 to be conducted across the drain and source electrodes thereof as long as the voltage is less than a voltage permissible for the protected IGFE transistor 10 to perform the normal operation. That is, under these circumstances, the second transistor should be a so-called field transistor. To this end, the second protecting IGFE transistor 26 can have its gate insulating film (not shown) thick enough to render a corresponding threshold voltage much higher than the abovementioned permissible voltage for the protected IGFE transistor 10. For example, the threshold voltage may be of −35 volts. With the threshold voltage specified above, it is assumed that a voltage applied to the input terminal 14 is less than the threshold voltage for the second protecting transistor 24. Under the assumed condition, the second protecting IGFE transistor 26 remains nonconducting so that the junction 26 is at ground potential. Thus the voltage applied to the input terminal 14 is transmitted to the gate electrode of the protected IGFE transistor 10 while the voltage is substantially intact. This results in the normal operation of the protected IGFE transistor 10.

It is now assumed that an overvoltage in excess of the permissible voltage for the protected IGFE transistor 10 is applied to the input terminal 14 so that the overvoltage exceeds the threshold voltage for the second protecting IGFE transistor 24. Under this assumed condition, the second protecting transistor 24 is conducted to provide at the source electrode or the connection point 26 an output voltage or a potential as determined by a ratio between the resistance of the second resistor 28 and the sum of the resistance of the first resistor 12 and a dynamic resistance presented by the now conducting transistor 24. In other words, the potential at the connection point 26 becomes higher than the ground potential presented thereby prior to the conduction of the transistor 24. At the same time, the junction 18 has a potential or a voltage as determined by a ratio between the sum of the dynamic resistance presented by the conducting transistor 24 and the resistance of the second resistor 28 and the resistance of the first resistor 12. Therefore the voltage at the junction 18 is less than the overvoltage applied to the input terminal 14.

In that event if the voltage at the connection point 26 is less than the threshold voltage for the first protecting IGFE transistor 22, then the latter remains nonconducting to permit the decreased voltage at the junction 18 to be applied to the gate electrode of the protected IGFE transistor 10. On the contrary, if the voltage at the point 26 exceeds the threshold voltage for the first protecting transistor 22 due to a further increase in the overvoltage applied to the input terminal 14 or its value initially high enough to do so, then the first protecting transistor 22 is brought into its conducting state. When the first protecting IGFE transistor 22 is in its conducting state, the junction 18 has a potential or a voltage as principally determined by a ratio between a dynamic resistance presented by the now conducting transistor 22 and the resistance of the first resistor 14. This potential is applied, as an input voltage, to the gate electrode of the protected IGFE transistor 10. It is noted that the first protecting IGFE transistor 22 is designed, when conducting, to present a low dynamic resistance so as to greatly decrease the potential at the junction 18 with the result that the protective effect becomes great.

Figure 6:
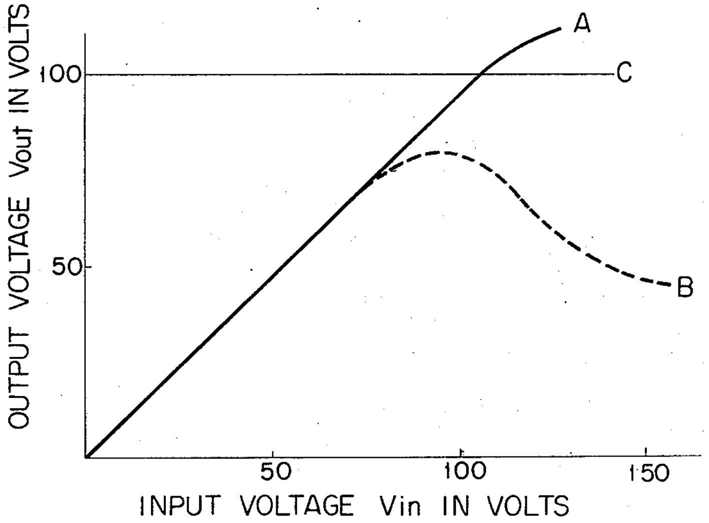
FIG. 6 is a graph illustrating the input-to-output voltage characteristic of the present device as compared with the prior art type device.

It is assumed that the first diffusion resistor 12 has a value of resistance of 2 kilohms and the second diffusion resistor 28 has a value of 20 kilohms. It is also assumed that the first protecting IGFE transistor 22 has a threshold voltage of −3 volts and a gain $\beta$ of 200 microampere has a 2 kilohms resistance and the second 24 has a threshold voltage of −35 volts and a gain $\beta$ of 1 microampere per square volt. Under the assumed condition, a voltage $V_{in}$ applied to the input terminal 14 results in an output voltage $V_{out}$ applied to the gate electrode of the protected IGFE transistor 10 as shown at dotted line B in FIG. 6 wherein the input voltage $V_{in}$ in volts (in ordinate) is plotted against the output voltage $V_{out}$ in volts (in abscissa). In FIG. 6, solid line A depicts a conventional protective device as shown in FIG. 1, and indicates that the output voltage $V_{out}$ is not much atenuated with respect to the input voltage $V_{in}$ applied to the input terminal 14. That is, the effect of protecting the protected IGFE transistor against overvoltages is small. For example, assuming that the protected IGFE transistor has a gate breakdown voltage of 100 volts as shown at horizontal line C in FIG. 6, the conventional protective device is effective only for input voltages up to 105 volts. Thus the protected transistor will be permanently broken down with an excessive voltage in excess of the value just specified applied to the input terminal 14.

Figure 3:
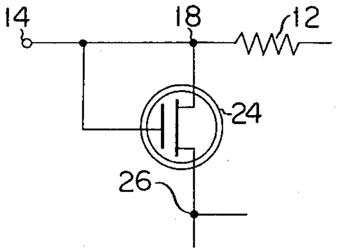
FIGS. 3 through 5 are fragmental circuit diagrams of different modifications of the present invention.

On the other hand, dotted line B as shown in FIG. 6 illustrating the arrangement of FIG. 3 describes that the output voltage $V_{out}$ is first increased in proportion to the input voltage $V_{in}$ as in the conventional arrangement until it reaches a maximum value less than 100 volts which is assumed to be a value of the gate breakdown voltage, for a input voltage slight less than 100 volts. Thereafter the output voltage is decreased with an increase in the input voltage. In other words, the arrangement of FIG. 2 is effective for satisfactorily protecting the protected IGFE transistor 10 against excessively high voltages which may be applied to the input terminal 14.

Figure 4:
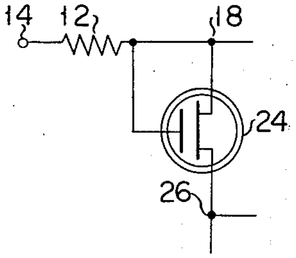
Figure 5:
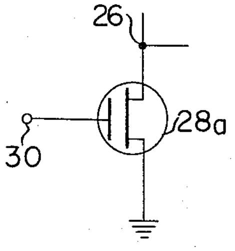

FIGS. 3, 4 and 5 wherein like reference numerals designate the components identical or similar to those shown in FIG. 2 illustrate various modifications of the present invention. In FIG. 3, the first diffusion resistor 12 is connected between the drain electrode of the second protecting IGFE transistor 24 and the drain electrode of the protecting IGFE transistor 24 and the drain electrode of the first protecting IGFE transistor 22 (not shown in FIG. 3). That is, the gate and drain electrodes of the second protecting transistor 24 are connected in an electric path connecting the input terminal 14 to the first resistor 12. In FIG. 4, the first resistor 12 is connected between the input terminal 14 and the gate electrode of the second protecting IGFE transistor 22. In other words, the gate and drain electrodes of the second protecting IGFE transistor 24 are connected in an electric path connecting the first resistor 12 to the gate electrode of the protected IGFE transistor 22 (not shown in FIG. 4).

From FIGS. 3 and 4 it will readily be understood that the first resistor 12 is only required to be connected in an electric path extending from the input terminal 14 to the drain electrode of the first protecting IGFE transistor 22. Therefore, the gate and drain electrodes of the second protecting IGFE transistor 24 may be connected at any desired points on the electric path extending from the input terminal 14 to the drain electrode of the first protecting IGFE transistor 22 particularly regardless of the position of the first resistor 12 relative to the input terminal 14 or the drain electrode of the first protecting transistor 22.

In the arrangement shown in FIG. 5, a separate or third protecting IGFE transistor 28*a* is substituted for the second diffusion resistor 28 shown in FIG. 2 with a gate terminal 30 of the transistor 28*a* connected to a suitable terminal of an electric source after source, The arrangements as shown in FIGS. 3, 4 and 5 provide excellent protection and have the characteristics substantially approximating what is shown at dotted line B in FIG. 6.

In summary, the present invention comprises using a first protecting IGFE transistor which is low in both threshold voltage and dynamic resistance to cause a ratio of voltage division between the dynamic resistance presented by that transistor in its conducting state and a resistance coupled to an input terminal to be small enough to attenuate or decrease a voltage applied to a protected IGFE transistor to a very low magnitude. Simultaneously, in order to prevent the normal operation of the protected IGFE transistor from being impeded due to the undesirable operation of the first protecting IGFE transistor, the first protecting transistor has its input to which a second protecting IGFE transistor is connected to permit the first protecting transistor to conduct only when the second protecting transistor is in its conducting state. An increase in thickness of a gate insulating film disposed in the second protecting IGFE transistor sufficient to render a threshold voltage thereof quite high ensures that the protected IGFE transistor is prevented from being impeded in the normal operation due to any undesirable operation of the first protecting IGFE transistor.

On the other hand, once any incoming excessive voltage has caused the second protecting IGFE transistor to be put in its conducting state, the first protecting IGFE transistor is conducted whenever the voltage is high enough to do so. This permits the voltage to be applied to the protected IGFE transistor only after the voltage has been greatly decreased in value as above described in conjunction with FIGS. 2 and 6.

As previously described, the arrangement of FIG. 1 includes a single protecting IGFE transistor having the dual function of detecting the arrival of an excessive voltage and dividing the voltage to attenuate it. Since the detection of the arrival of a voltage is inconsistent with the voltage division, conventional devices such as shown in FIG. 1 have been unalike to satisfactorily perform the dual function.

In contrast, the present invention comprises a first protecting IGFE transistor serving to divide an incoming voltage and a second protecting IGFE transistor principally serving to detect the arrival of the voltage. Therefore each of the protecting IGFE transistors can be designed so as to perform only its respective function so that the resulting device can perform satisfactorily and simultaneously both functions.

From the foregoing, it will be appreciated that the object of the present invention has been accomplished by the addition of a protecting IGFE transistor electrically connected between an input terminal and a gate electrode of an IGFE transistor to be protected as compared with the prior art practice.

While the present invention has been illustrated and described in conjunction with a few preferred embodiments thereof it is to be understood that numerous changes and modifications may be resorted to without departing from the spirit and scope of the invention. For example, instead of the diffusion resistors 12 and 28 formed by a impurity diffusion process, the resistors may be formed by any desired process as by forming film resistors on the associated insulating film in the manner well known in the art.

What we claim is:

1. A semiconductor device, comprising: an insulated gate field effect transistor to be protected against overvoltages including a first gate electrode, a first source electrode and a first drain electrode; an input terminal; a resistor connected to said input terminal and to said first gate electrode of said protected, insulated gate field effect transistor; a first protecting insulated gate field effect transistor having a threshold voltage level and including a second drain electrode connected to said first gate electrode of said protected transistor a second source electrode connected to said first source electrode of said protected, insulated gate field effect transistor, and a second gate electrode; a second protecting, insulated gate field effect transistor having a second threshold voltage level higher than the threshold voltage level of said first protecting, insulated gate field effect transistor; and means for electrically connecting said second protecting insulated gate field effect transistor to both said input terminal and said first protecting, insulated gate field effect transistor, said second, protecting, insulated gate field effect transistor having a third source electrode connected to said second gate electrode of said first protecting, insulated field effect transistor and being responsive to a voltage applied to said input terminal in excess of the second threshold voltage level to thus conduct and provide an output voltage and said first protecting, insulated gate field effect transistor being responsive to said output voltage from said second protecting, insulated gate field effect transistor and being conductive, thus applying a reduced voltage to said first gate electrode of said protected, insulated gate field effect transistor.

2. A semiconductor device, comprising in combination: an insulated gate field effect transistor to be protected against overvoltages including a first gate electrode, a first source electrode and a first drain electrode; an input terminal; a first protecting insulated gate field effect transistor having a first threshold voltage level and including a second drain electrode and a second source electrode respectively connected to said first gate and first source electrodes of said protected, insulated gate field effect transistor and further including a second gate electrode; a first resistor connected to said input terminal and to said second drain electrode of said first protecting, insulated gate field effect transistor; a second protecting, insulated gate field effect transistor including a third gate electrode connected to said input terminal, a third drain electrode connected to said second drain electrode of said first protecting, insulated gate field effect transistor and a third source electrode; a second resistor connected to said third source electrode of said second protecting insulated gate field effect transistor and to said first source electrode of said protected insulated gate field effect transistor, the junction of said second resistor and said third source electrode of said second protecting insulated gate field effect transistor being connected to said second gate electrode of said first protecting, insulated gate field effect transistor, said second protecting, insulated gate field effect transistor having a second threshold voltage higher than the first threshold voltage of said first protecting, insulated gate field effect transistor and being responsive to a voltage applied to said input terminal in excess of the second threshold voltage and providing an output voltage, said first protecting, insulated gate field effect transistor being responsive to said output voltage from said second protecting, insulated gate field effect transistor exceeding the first threshold voltage to become conductive and thus apply a reduced voltage to said first gate electrode of said protected, insulated gate field effect transistor.

3. A semiconductor device, comprising in combination: an insulated gate field effect transistor to be protected against overvoltages including a first gate electrode, a first source electrode and a first drain electrode; an input terminal; a first protecting insulated gate field effect transistor having a first threshold level and including a second drain electrode and a second source electrode respectively connected to said first gate and first source electrodes of said protected, insulated gate field effect transistor and further including a second gate electrode; a first resistor connected between said input terminal and said second drain electrode of said first protecting, insulated gate field effect transistor; a second protecting, insulated gate field effect transistor including a third gate electrode and a third drain electrode connected together to said input terminal, and a third source electrode; and a second resistor connected between said third source electrode of said second protecting, insulated gate field effect transistor and said first source electrode of said protected, insulated gate field effect transistor, the junction of said second resistor and said third source electrode of said second protecting, insulated gate field effect transistor being connected to said first gate electrode of said first protecting, insulated gate field effect transistor said second protecting, insulated gate field effect transistor having a second threshold voltage level higher than the first threshold voltage level of said first protecting, insulated gate field effect transistor and being responsive to a voltage in excess of the second threshold voltage level applied to said input terminal to provide an output voltage to said first protecting, insulated gate field effect transistor exceeding the first threshold voltage and thus providing a reduced voltage to said first gate electrode of said protected, insulated gate field effect transistor.

4. A semiconductor device, comprising in combination: an insulated gate field effect transistor to be protected against overvoltages including a first gate electrode a first source electrode and a first drain electrode; an input terminal; a first protecting insulated gate field effect transistor having a first threshold voltage level including a second drain electrode and a second source electrode connected to said first gate and first source electrode of said protected, insulated gate field effect transistor respectively and further including a second gate electrode; a first resistor connected between said input terminal and said second drain electrode of said first protecting, insulated gate field effect transistor; a second protecting, insulated gate field effect transistor including third gate electrode and a third drain electrode both connected to an electric path connecting said first resistor to said second drain electrode of said first protecting, insulated gate field effect transistor and further including a third source electrode; and a second resistor connected between said source electrode of said second protecting, insulated gate field effect transistor and said first source electrode of said protected, insulated gate field effect transistor, the junction of said second resistor and said third source electrode of said second protecting, insulated gate field effect transistor being connected to said second gate electrode of said first protecting, insulated gate field effect transistor, said second protecting, insulated gate field effect transistor having a second threshold voltage level higher than the first threshold voltage level of said first protecting insulated gate field effect transistor and being responsive to a voltage in excess of the second threshold voltage applied to said input terminal to provide an output voltage, said first protecting, insulated gate field effect transistor being responsive to said output voltage from said second protecting, insulated gate field effect transistor exceeding the first threshold voltage and providing a reduced voltage to said gate electrode of said protected, insulated gate field effect transistor.

5. A semiconductor device, comprising in combination: an insulated gate field effect transistor to be protected against overvoltages including a first gate electrode, a first source electrode and a first drain electrode, an input terminal; a first protecting, insulated gate field effect transistor having a first threshold and a second source electrode connected respectively to said gate and source electrodes of said protected, insulated gate field effect transistor and further including a second gate electrode; a resistor connected between said input terminal and said first gate electrode of said protected, insulated gate field effect transistor; a second protecting, insulated gate field effect transistor including a third gate electrode and a third drain electrode both connected to an electric path connecting said input terminal to said second drain electrode of said first protecting insulated gate field effect transistor and further including a third source electrode connected to said second gate electrode of said first protecting, insulated gate field effect transistor, said second protecting, insulated gate field effect transistor having a second threshold voltage level higher than the first threshold voltage of said first protecting, insulated gate field effect transistor; and a third protecting, insulated gate field effect transistor including a fourth gate electrode connected to an electric source, a fourth drain electrode connected to said third source electrode of said second protecting, insulated gate field effect transistor being responsive to a voltage in excess of the second threshold voltage applied to said input terminal to provide an output voltage, and a fourth source electrode connected to said first source electrode, said first protecting, insulated gate field effect transistor being responsive to said output voltage from said second protecting, insulated gate field effect transistor exceeding the first threshold voltage to provide a reduced voltage to said gate electrode of said protected, insulated gate field effect transistor.

* * * * *